United States Patent
Laddu et al.

(10) Patent No.: US 11,146,358 B2
(45) Date of Patent: Oct. 12, 2021

(54) POLAR CODES FOR DOWNLINK CONTROL CHANNELS FOR WIRELESS NETWORKS

(71) Applicant: NOKIA TECHNOLOGIES OY, Espoo (FI)

(72) Inventors: Keeth Saliya Jayasinghe Laddu, Piliyandala (LK); Yi Zhang, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/469,629

(22) PCT Filed: Dec. 13, 2016

(86) PCT No.: PCT/EP2016/080800
§ 371 (c)(1),
(2) Date: Jun. 13, 2019

(87) PCT Pub. No.: WO2018/108247
PCT Pub. Date: Jun. 21, 2018

(65) Prior Publication Data
US 2019/0312679 A1    Oct. 10, 2019

(51) Int. Cl.
*H04J 3/16*    (2006.01)
*H04L 1/00*    (2006.01)
(Continued)

(52) U.S. Cl.
CPC ........ *H04L 1/0063* (2013.01); *H03M 13/095* (2013.01); *H03M 13/13* (2013.01);
(Continued)

(58) Field of Classification Search
None
See application file for complete search history.

(56) References Cited

U.S. PATENT DOCUMENTS

2009/0022178 A1 *    1/2009    Ji ......................... H04L 5/0094
                                                             370/470
2014/0092830 A1    4/2014    Chen et al.
(Continued)

FOREIGN PATENT DOCUMENTS

CN    101594205 A    12/2009
CN    103563322 A    2/2014
(Continued)

OTHER PUBLICATIONS

International Search Report and Written Opinion for Application No. PCT/EP2016/080800, dated Aug. 10, 2017, 16 pages.
(Continued)

*Primary Examiner* — Sithu Ko
(74) *Attorney, Agent, or Firm* — Brake Hughes Bellermann LLP

(57) ABSTRACT

Polar Codes for Downlink Control Channels for Wireless Networks A technique is provided for decoding downlink control information that was encoded using polar encoding, the technique including: attempting, based on an initial assumption by a user device of a segmented downlink control information, to decode a first codeword provided via a user device-specific resource, the first codeword including a first downlink control information segment and a pointer to a second downlink control information segment of a segmented downlink control information; decoding, if the attempting to decode is successful, based on the pointer, a second codeword that includes the second downlink control information segment of the segmented downlink control information; and otherwise, if the attempting to decode is unsuccessful, making an assumption of a non-segmented downlink control information and decoding a third codeword to obtain a non-segmented downlink control information.

20 Claims, 10 Drawing Sheets

(51) Int. Cl.
*H03M 13/09* (2006.01)
*H03M 13/13* (2006.01)
*H04W 72/04* (2009.01)
*H04L 5/00* (2006.01)

(52) U.S. Cl.
CPC .......... *H04L 1/0038* (2013.01); *H04L 1/0061* (2013.01); *H04L 5/0053* (2013.01); *H04W 72/042* (2013.01); *H04L 1/0057* (2013.01)

(56) References Cited

U.S. PATENT DOCUMENTS

| | | | |
|---|---|---|---|
| 2016/0128028 A1* | 5/2016 | Mallik | H04L 5/0053 370/336 |
| 2017/0230994 A1* | 8/2017 | You | H04L 5/0053 |
| 2017/0332359 A1* | 11/2017 | Tsai | H04B 7/0639 |
| 2017/0366199 A1* | 12/2017 | Ge | G06F 11/1004 |
| 2018/0048418 A1* | 2/2018 | Ge | H04L 1/0046 |
| 2018/0092070 A1* | 3/2018 | Liao | H04L 5/0094 |
| 2018/0167959 A1* | 6/2018 | Liao | H04W 72/1273 |
| 2019/0052418 A1* | 2/2019 | Li | H04L 1/203 |

FOREIGN PATENT DOCUMENTS

| | | |
|---|---|---|
| CN | 103716144 A | 4/2014 |
| CN | 104040919 A | 9/2014 |
| CN | 104871448 A | 8/2015 |
| EP | 2341678 A1 | 7/2011 |
| WO | 2009012272 A2 | 1/2009 |

OTHER PUBLICATIONS

3GPP TSG RAN WG1 Meeting #87, R1-1612135; Agenda Item: 7.1.5.1; Source: MediaTek Inc.; "Comparison of Coding Candidates for DL Control Channels and Extended Applications"; Reno, NV, USA; Nov. 14-18, 2016; 5 pages.

3GPP TSG RAN WG1 Meeting #87, R1-1612121; Agenda Item: 7.1.4.1; Source: MediaTek Inc.; "On 2-Stage Downlink Control Information for NR"; Reno, NV, USA; Nov. 14-18, 2016; 5 pages.

3GPP TSG RAN WG1 Meeting #86bis, R1-1609432; Agenda Item: 8.1.7.1; Source: Huawei, HiSilicon; "Ddiscussion on Downlink Control Channel Design"; Lisbon, Portugal; Oct. 10-14, 2016; 5 pages.

3GPP TSG RAN WG1 Meeting #87, R1-1611254; Agenda Item: 7.1.5.1; Source: Huawei, Hisilicon; "Details of The Polar Code Design"; Reno, NV, USA; Nov. 10-14, 2016; 15 pages.

3GPP TSG RAN WG1 #86bis, R1-1610784; Agenda Item: 8.1.7.1; "We on DL Control Channel Design"; Lisbon, Portugal; Oct. 10-14, 2016; 2 pages.

Office Action for Chinese Application No. 201680092062.7, dated Jun. 8, 2021, 18 pages.

3GPP TSG RAN WG1 Meeting #87, R1-1611704; "Downlink Control Channel Design Consideration", Reno, USA Source: Guangdong OPPO Mobile Telecom; Agenda Item: 7.1.4.1; Reno, Nevada, USA; Nov. 14-18, 2016 5 pages.

Kai Niu et al.; "CRC-Aided Decoding of Polar Codes"; IEEE Communications Letters (vol. 16, Issue: 10, Oct. 2012); pp. 1668-1671.

* cited by examiner

US 11,146,358 B2

POLAR CODES FOR DOWNLINK CONTROL CHANNELS FOR WIRELESS NETWORKS

CROSS-REFERENCE TO RELATED APPLICATIONS

This application is a national stage entry of International Application No. PCT/EP2016/080800 filed Dec. 13, 2016, entitled "POLAR CODES FOR DOWNLINK CONTROL CHANNELS FOR WIRELESS NETWORKS" which is hereby incorporated by reference in its entirety.

TECHNICAL FIELD

This description relates to communications, and in particular, to a polar codes for downlink control channels for wireless networks.

BACKGROUND

A communication system may be a facility that enables communication between two or more nodes or devices, such as fixed or mobile communication devices. Signals can be carried on wired or wireless carriers.

An example of a cellular communication system is an architecture that is being standardized by the $3^{rd}$ Generation Partnership Project (3GPP). A recent development in this field is often referred to as the long-term evolution (LTE) of the Universal Mobile Telecommunications System (UMTS) radio-access technology. S-UTRA (evolved UMTS Terrestrial Radio Access) is the air interface of 3GPP's Long Term Evolution (LTE) upgrade path for mobile networks. In LTE, base stations or access points (APs), which are referred to as enhanced Node AP (eNBs), provide wireless access within a coverage area or cell. In LTE, mobile devices, user devices or mobile stations are referred to as user equipments (UEs).

A downlink control channel, such as a physical downlink control channel (PDCCH), may be used to carry downlink control information (DCI), such as a downlink scheduling assignment(s) (e.g., including resource information and transport format, control information for spatial multiplexing), an uplink scheduling grant(s) (e.g., including resource information and transport format), power control information or power control commands for one or more terminals or UEs, and/or other downlink control information.

SUMMARY

According to an example implementation, a method is provided for decoding downlink control information that was encoded using polar encoding, the method including: attempting, based on an initial assumption by a user device of a segmented downlink control information, to decode a first codeword provided via a user device-specific resource, the first codeword including a first downlink control information segment and a pointer to a second downlink control information segment of a segmented downlink control information; decoding, if the attempting to decode is successful, based on the pointer, a second codeword that includes the second downlink control information segment of the segmented downlink control information; and otherwise, if the attempting to decode is unsuccessful, making an assumption of a non-segmented downlink control information and decoding a third codeword to obtain a non-segmented downlink control information.

According to an example implementation, an apparatus includes at least one processor and at least one memory including computer instructions, when executed by the at least one processor, cause the apparatus to decode downlink control information that was encoded using polar encoding, including causing the apparatus to: attempt, based on an initial assumption by a user device of a segmented downlink control information, to decode a first codeword provided via a user device-specific resource, the first codeword including a first downlink control information segment and a pointer to a second downlink control information segment of a segmented downlink control information; decode, if the attempting to decode is successful, based on the pointer, a second codeword that includes the second downlink control information segment of the segmented downlink control information; and otherwise, if the attempting to decode is unsuccessful, make an assumption of a non-segmented downlink control information and decoding a third codeword to obtain a non-segmented downlink control information.

According to an example implementation, a computer program product includes a non-transitory computer-readable storage medium and storing executable code that, when executed by at least one data processing apparatus, is configured to cause the at least one data processing apparatus to perform a method including: decoding downlink control information that was encoded using polar encoding, the method including: attempting, based on an initial assumption by a user device of a segmented downlink control information, to decode a first codeword provided via a user device-specific resource, the first codeword including a first downlink control information segment and a pointer to a second downlink control information segment of a segmented downlink control information; decoding, if the attempting to decode is successful, based on the pointer, a second codeword that includes the second downlink control information segment of the segmented downlink control information; and otherwise, if the attempting to decode is unsuccessful, making an assumption of a non-segmented downlink control information and decoding a third codeword to obtain a non-segmented downlink control information.

According to an example implementation, a method is provided for decoding downlink control information that was encoded using polar encoding, the method including: receiving, by a user device in a wireless network via a user device-specific resource, a first codeword; attempting to decode the first codeword to obtain a first information word that includes a first downlink control information segment of a segmented downlink control information and a pointer to a second resource to receive a second information word including a second downlink control information segment of the segmented downlink control information; and performing the following if the attempting to decode the first codeword is successful: receiving, via the second resource included in the first information word, a second codeword; and decoding the second codeword to obtain a second information word including a second downlink control information segment of the segmented downlink control information.

According to an example implementation, an apparatus includes at least one processor and at least one memory including computer instructions, when executed by the at least one processor, cause the apparatus to decode downlink control information that was encoded using polar encoding, including causing the apparatus to: receive, by a user device in a wireless network via a user device-specific resource, a first codeword; attempt to decode the first codeword to obtain a first information word that includes a first downlink control information segment of a segmented downlink control information and a pointer to a second resource to receive a second information word including a second downlink control information segment of the segmented downlink control information; and perform the following if the attempting to decode the first codeword is successful: receive, via the second resource included in the first information word, a second codeword; and decode the second codeword to obtain a second information word including a second downlink control information segment of the segmented downlink control information.

According to an example implementation, a computer program product includes a non-transitory computer-readable storage medium and storing executable code that, when executed by at least one data processing apparatus, is configured to cause the at least one data processing apparatus to perform a method including: decoding downlink control information that was encoded using polar encoding, the method including: receiving, by a user device in a wireless network via a user device-specific resource, a first codeword; attempting to decode the first codeword to obtain a first information word that includes a first downlink control information segment of a segmented downlink control information and a pointer to a second resource to receive a second information word including a second downlink control information segment of the segmented downlink control information; and performing the following if the attempting to decode the first codeword is successful: receiving, via the second resource included in the first information word, a second codeword; and decoding the second codeword to obtain a second information word including a second downlink control information segment of the segmented downlink control information.

The details of one or more examples of implementations are set forth in the accompanying drawings and the description below. Other features will be apparent from the description and drawings, and from the claims.

DETAILED DESCRIPTION

Figure 1:
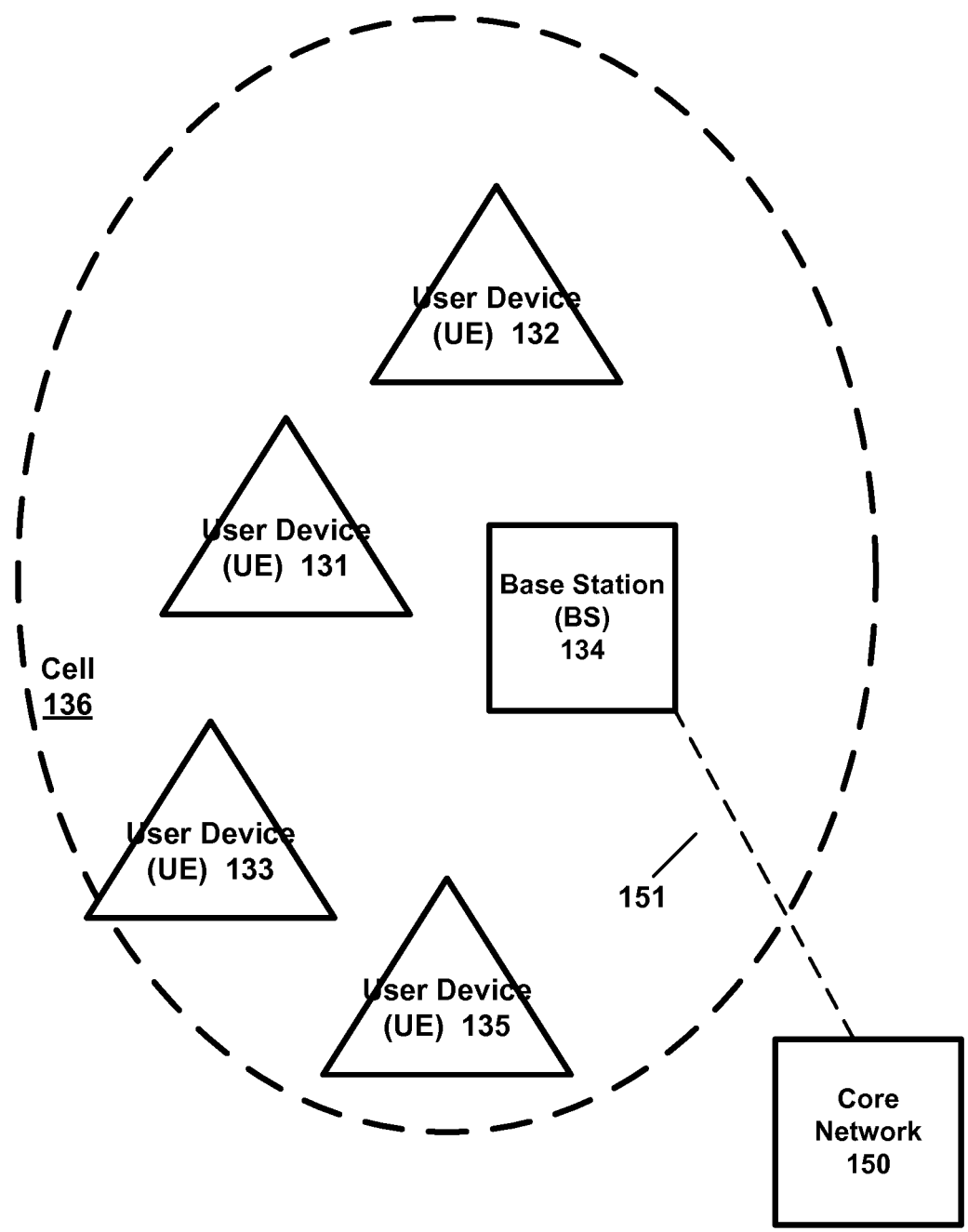
FIG. 1 is a block diagram of a wireless network according to an example implementation.

FIG. 1 is a block diagram of a wireless network 130 according to an example implementation. In the wireless network 130 of FIG. 1, user devices 131, 132, 133 and 135, which may also be referred to as mobile stations (MSs) or user equipment (UEs), may be connected (and in communication) with a base station (BS) 134, which may also be referred to as an access point (AP), an enhanced Node B (eNB) or a network node. At least part of the functionalities of an access point (AP), base station (BS) or (e)Node B (eNB) may be also be carried out by any node, server or host which may be operably coupled to a transceiver, such as a remote radio head. BS (or AP) 134 provides wireless coverage within a cell 136, including to user devices 131, 132, 133 and 135. Although only four user devices are shown as being connected or attached to BS 134, any number of user devices may be provided. BS 134 is also connected to a core network 150 via a S1 interface 151. This is merely one simple example of a wireless network, and others may be used.

A user device (user terminal, user equipment (UE) or mobile station) may refer to a portable computing device that includes wireless mobile communication devices operating with or without a subscriber identification module (SIM), including, but not limited to, the following types of devices: a mobile station (MS), a mobile phone, a cell phone, a smartphone, a personal digital assistant (PDA), a handset, a device using a wireless modem (alarm or measurement device, etc.), a laptop and/or touch screen computer, a tablet, a phablet, a game console, a notebook, and a multimedia device, as examples. It should be appreciated that a user device may also be a nearly exclusive uplink only device, of which an example is a camera or video camera loading images or video clips to a network.

By way of illustrative example, the various example implementations or techniques described herein may be applied to various user devices, such as machine type communication (MTC) user devices, enhanced machine type communication (eMTC) user devices, Internet of Things (IoT) user devices, and/or narrowband IoT user devices. IoT may refer to an ever-growing group of objects that may have Internet or network connectivity, so that these objects may send information to and receive information from other network devices. For example, many sensor type applications or devices may monitor a physical condition or a status, and may send a report to a server or other network device, e.g., when an event occurs. Machine Type Communications (MTC, or Machine to Machine communications) may, for example, be characterized by fully automatic data generation, exchange, processing and actuation among intelligent machines, with or without intervention of humans.

Also, in an example implementation, a user device or UE may be a UE/user device with ultra reliable low latency communications (URLLC) applications. A cell (or cells) may include a number of user devices connected to the cell, including user devices of different types or different categories, e.g., including the categories of MTC, NB-IoT, URLLC, or other UE category.

In LTE (as an example), core network 150 may be referred to as Evolved Packet Core (EPC), which may include a mobility management entity (MME) which may handle or assist with mobility/handover of user devices between BSs, one or more gateways that may forward data and control signals between the BSs and packet data networks or the Internet, and other control functions or blocks.

The various example implementations may be applied to a wide variety of wireless technologies or wireless networks, such as LTE, LTE-A, 5G, cmWave, and/or mmWave band networks, IoT, MTC, eMTC, URLLC, etc., or any other wireless network or wireless technology. These example networks or technologies are provided only as illustrative examples, and the various example implementations may be applied to any wireless technology/wireless network.

Polar codes are a new and promising channel coding scheme to approach communication channel capacity, which is a linear block code developed by Erdal Arikan. It is the first channel code with an explicit construction to achieve the capacity of symmetric binary-input, discrete, memoryless channels (BI-DMCs). Polar codes have comparable and sometimes even better performance to state-of-the-art codes like LDPC, meanwhile the decoding complexity of polar codes is as low as O(LN log N). Here N is the encoded block length and L is the list size. These features make polar codes very attractive for many applications, like digital communications and storage.

Figure 2:
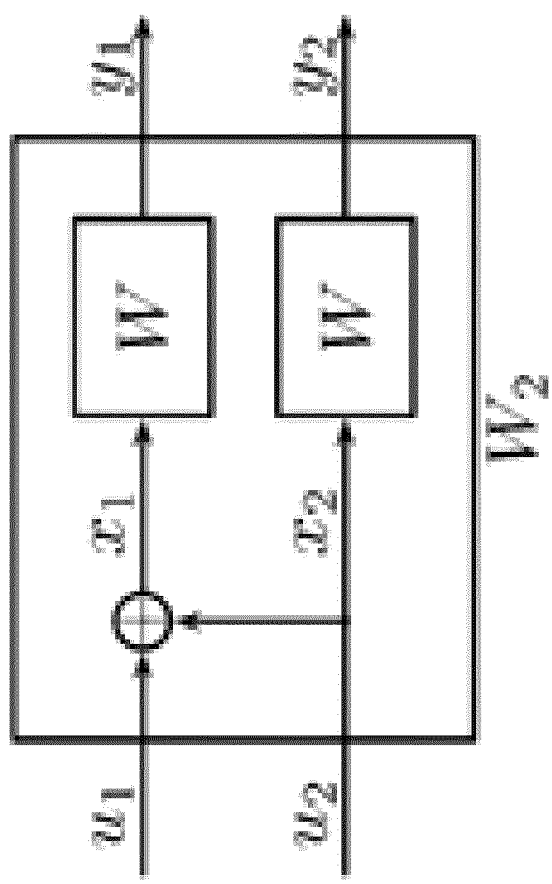
FIG. 2 is a diagram illustrating a 2-bit polar encoder according to an example implementation.

Polar codes are based on the concept of polarization. The basic building block in polar codes can be depicted shown in FIG. 2. FIG. 2 is a diagram illustrating a 2-bit polar encoder according to an example implementation. Here $u_i$ refer to the input bits of the encoder, and $y_i$ refer to the output/encoded bits of the encoder. It can be shown that in this configuration, the mutual information $I(U_1; Y_1, Y_2)$ decreases compared to the pre-polarized pair, $I(U_1; Y_1)$, while $I(U_2; Y_1, Y_2, U_1)$ increases compared to $I(U_2; Y_2)$. In this way, one channel is degraded and the other one is upgraded. This phenomenon is called channel polarization. As shown in FIG. 2, u1 and u2 are information bits, where an XOR (exclusive OR or modulo-2 addition operation) is performed on information bits u1 and u2 to produce code bit x1, and u2 is passed through (without any XOR operation) to produce code bit x2. Code bits x1 and x2 are transmitted over channel W to provide received code bits (or encoded bits) y1 and y2, respectively. Two bit channels are shown in the two-bit polar encoder of FIG. 2, including a bit channel for bit u1, and a bit channel for bit u2. The channel capacity for bit channel for u2 is increased or enhanced, while the channel capacity for the u1 bit channel is decreased. Bit channel for bit u1 is decreased due to u2 interfering based on a XOR or modulo-2 addition of u1 and u2 to produce x1. No interference occurs (or XOR operation occurs) for x2, and thus, u2 channel capacity is increased, resulting in a corresponding decrease in channel capacity for u1/x1 channel. This process may be repeated, to cause some channels to increase in capacity, and other channel to decrease in capacity, which causes polarization. For example, polar codes may be used to enhance channel capacity of one or more bit channels, while similarly decreasing channel capacities of one or more other bits channels. Data may then be transmitted over the enhanced channels (having increased channel capacities), and fixed values or frozen bits, e.g., zeros, may be transmitted over the decreased channels.

Figure 3:
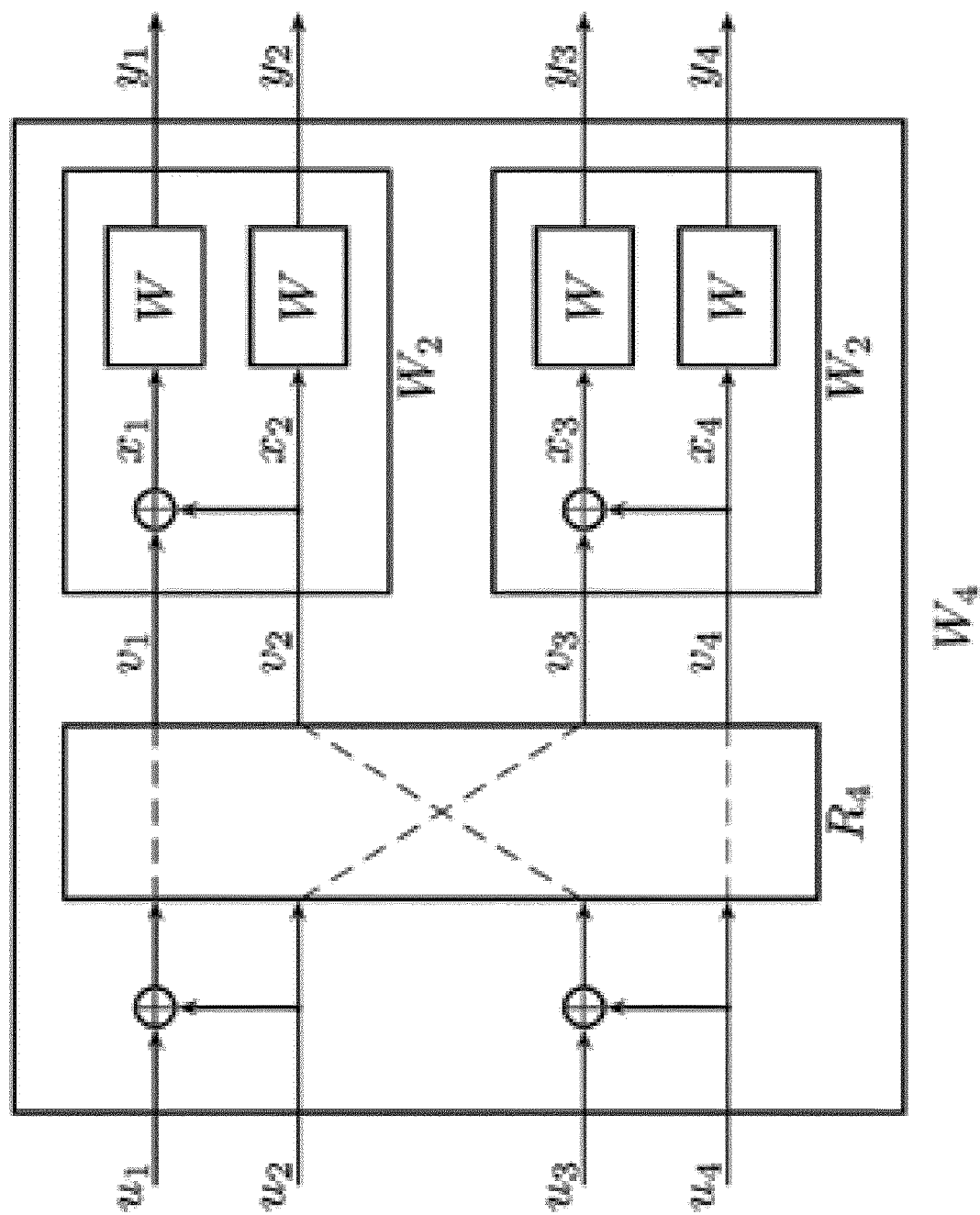
FIG. 3 is a diagram illustrating a 4-bit polar encoder according to an example implementation.

FIG. 3 is a diagram illustrating a 4-bit polar encoder according to an example implementation. By systematically replicating and stacking the basic blocks (e.g., see FIG. 2 for an example basic building block), longer polar codes can be constructed. For example, the FIG. 3 characterizes a length-4 polar code. R4 refers to a reverse shuffle of the inputs or permutation, e.g., with 4 inputs, 4 outputs. Two of the 2-bit polar encoders (basic building block for polar encoder) shown in FIG. 2, are included within this 4 bit polar encoder of FIG. 3, for example.

As shown in FIG. 3, the channel capacity (and thus, reliability) for input bit u4 is enhanced twice based on absence of XOR operations between u4 and y4, resulting in a twice-enhanced channel at output bit y4. Similarly, channel for input bit u1 is decreased twice, e.g., based on first XOR operation with u2, and then v1 XOR with x2, to cause output bit y1 to be twice decreased in channel capacity. Channels for u2 and u3 are in-between (being increased and decreased channel capacity).

As the number of layers grows up, the channels are kept being degraded and upgraded. In other words, the polarization effect becomes more and more visible. Eventually, some channels would have zero (or at least very low) capacity and the other channels would become error-free (or at least much higher capacity). Thus, for example, the bits transmitted over higher capacity channels may typically have higher reliability than bits transmitted over lower capacity channels. Based on the polar coding/encoding, a transmitting device may determine which bits to transmit on higher capacity (or higher reliability) channels, and which bits should be transmitted on lower capacity (or lower reliability) channels. For example, according to an example implementation, some fields of an information word may be deemed to be more critical or important, and thus, may be transmitted via higher capacity channels or higher reliability channels. For example, a CRC may be transmitted over the highest reliability bits/channels, or data, or other control information may be transmitted or prioritized for transmission over the highest reliability (or highest capacity) bits or channels, based on the polar encoding. The idea of polar codes is to choose the error-free channels to transmit information bits and force the value of the bits transmitted in the zero-capacity channels to be some known value, e.g., 0. These bits are called frozen bits.

By choosing the K best channels out of the total N polarized channels, a rate K/N polar code can be obtained. In the example shown in FIG. 3, K=2 may be selected with $(u_3, u_4)$ as information bits, and $(u_1, u_2)$ as frozen bits. Effectively a polar code of rate 1/2 is constructed, in this manner, as an illustrative example.

Figure 4:
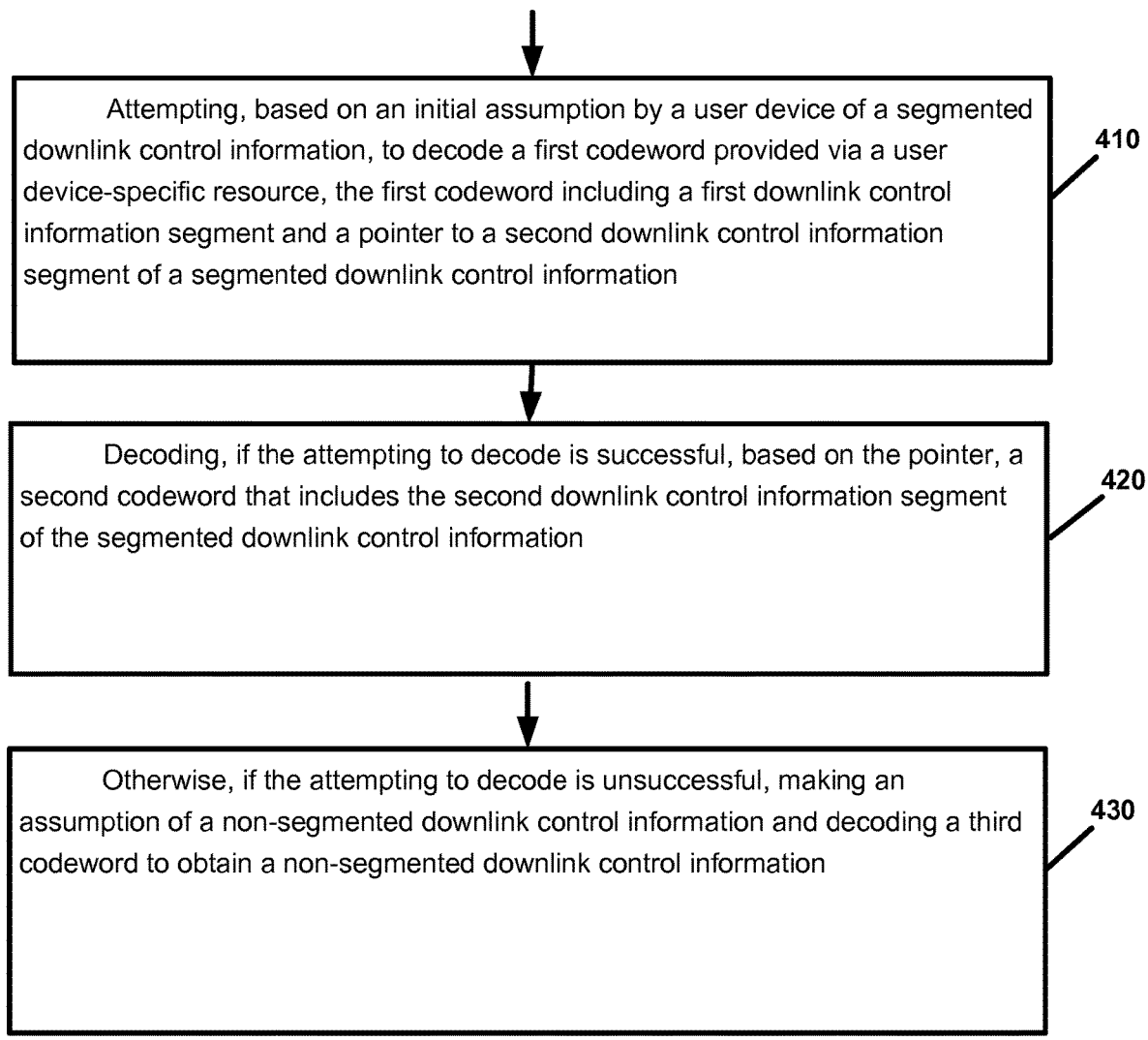
FIG. 4 is a flow chart illustrating operation of a user device according to an example implementation.

FIG. 4 is a flow chart illustrating operation of a user device according to an example implementation. The flow chart of FIG. 4 illustrates an example method of decoding downlink control information that was encoded using polar encoding. In the example method of claim 4, the user device may first attempt to decode downlink control information (DCI) as a segmented DCI (e.g., based on an initial assumption that DCI is sent to the user device as multi-stage DCI or a segmented DCI, where a first DCI segment may be sent or transmitted to the user device via a user device-specific resource. For example, the user device is unable to decode the first DCI segment (of a segmented DCI), then the user device will attempt to decode an unsegmented DCI (e.g., based on an assumption that the DCI is sent to the user device as a single stage or unsegmented DCI.

Referring to FIG. 4, operation 410 includes attempting, based on an initial assumption by a user device of a segmented downlink control information, to decode a first codeword provided via a user device-specific resource, the first codeword including a first downlink control information segment and a pointer to a second downlink control information segment of a segmented downlink control information. Operation 420 includes decoding, if the attempting to decode is successful, based on the pointer, a second codeword that includes the second downlink control information segment of the segmented downlink control information. And, operation 430 includes otherwise, if the attempting to decode is unsuccessful, making an assumption of a non-segmented downlink control information and decoding a third codeword to obtain a non-segmented downlink control information.

According to an example implementation of the method of FIG. 4, the user device-specific resource includes: a user device-specific resource for aggregation level=1, which is associated with one control channel element (CCE).

According to an example implementation of the method of FIG. 4, at least one of a downlink control information segment, the pointer and a cyclic redundancy check are assigned to bits or channels having higher capacity based on polar encoding.

According to an example implementation of the method of FIG. 4, and further including receiving, by the user device, control information indicating an operating bandwidth for the user device, and determining a size or number of bits of the pointer based on the operating bandwidth.

Figure 5:
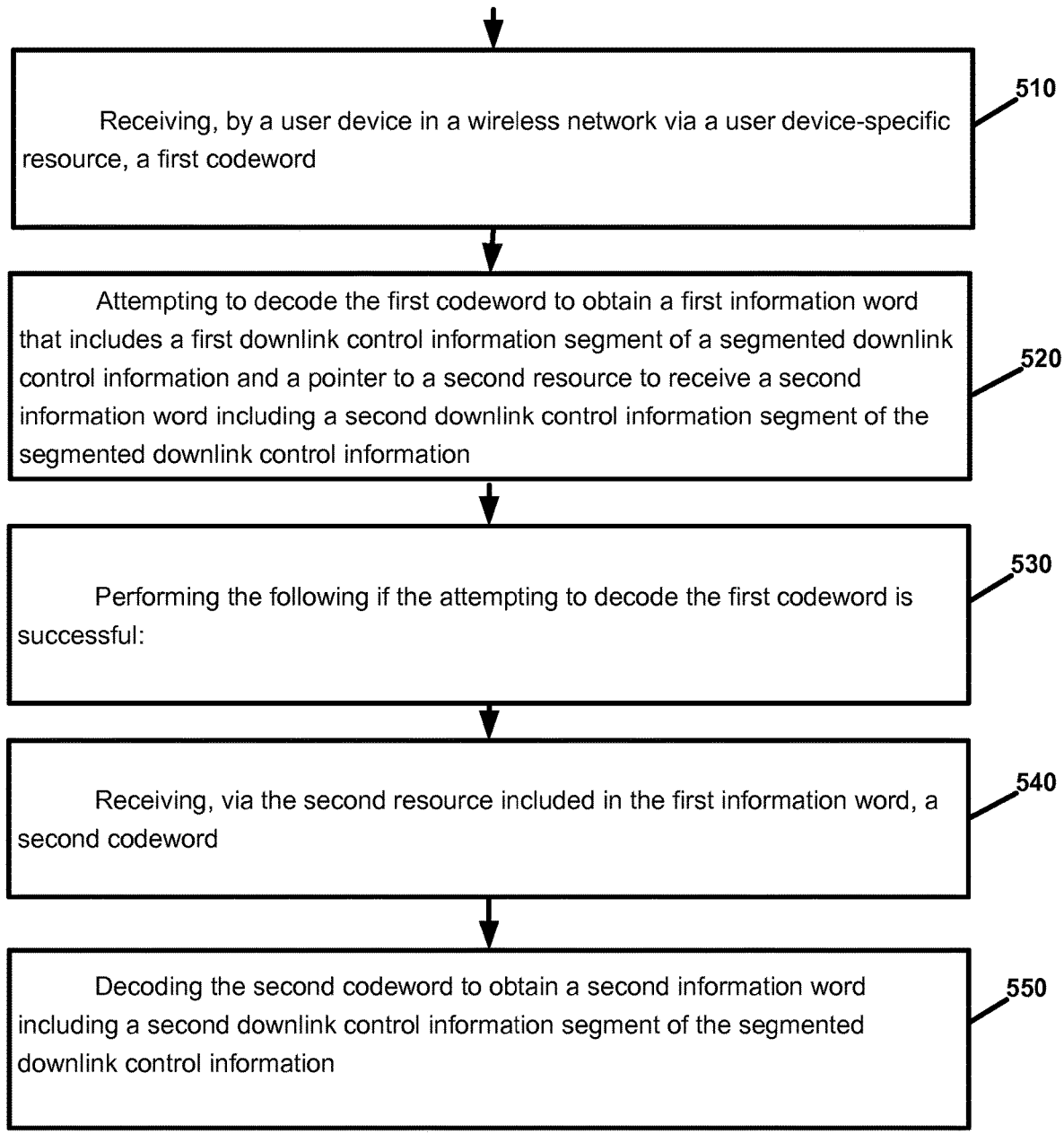
FIG. 5 is a flow chart illustrating operation of a user device according to another example implementation.

FIG. 5 is a flow chart illustrating operation of a user device according to another example implementation. The flow chart of FIG. 5 may be directed to a method of decoding downlink control information that was encoded using polar encoding. Operation 510 may include receiving, by a user device in a wireless network via a user device-specific resource, a first codeword. Operation 520 includes attempting to decode the first codeword to obtain a first information word that includes a first downlink control information segment of a segmented downlink control information and a pointer to a second resource to receive a second information word including a second downlink control information segment of the segmented downlink control information. Operation 530 includes performing the operations 540 and 550 if the attempting to decode the first codeword is successful. Operation 540 includes receiving, via the second resource included in the first information word, a second codeword. And, operation 550 includes decoding the second codeword to obtain a second information word including a second downlink control information segment of the segmented downlink control information.

According to an example implementation of the method of FIG. 5, further including performing the following if the attempting to decode the first codeword is not successful: receiving a third codeword, and decoding the third codeword to obtain an unsegmented downlink control information.

According to an example implementation of the method of FIG. 5, the receiving a first codeword may include: receiving, by a user device in a wireless network via a user device-specific resource associated with a lowest resource aggregation level of a plurality of resource aggregation levels, a first codeword.

According to an example implementation of the method of FIG. 5, the method including first, attempting to decode the first codeword, which was received via a user device-specific resource location for segmented downlink control information, to obtain a first information word that includes the first downlink control information segment of the segmented downlink control information, based on an initial assumption that downlink control information is sent to the user device as a segmented downlink control information, and second, if the attempting to decode the first codeword to obtain a first downlink control information segment is unsuccessful, then decoding the third codeword to obtain an unsegmented downlink control information based on an assumption that downlink control information is sent to the user device as an unsegmented downlink control information.

According to an example implementation of the method of FIG. 5, the user device-specific resource associated with a lowest resource aggregation level may include: a user device-specific resource for aggregation level=1, which is associated with one control channel element (CCE).

According to an example implementation of the method of FIG. 5, the first information word includes a first downlink control information segment of the segmented downlink control information, a pointer to the second resource to receive the second information word including the second downlink control information segment, and a cyclic redundancy check (CRC) bits, wherein user device-specific scrambling has been performed on the first downlink control information segment of the segmented downlink control information and the pointer to the second resource but not on the CRC bits.

According to an example implementation of the method of FIG. 5, and further including receiving, by the user device, control information indicating an operating bandwidth for the user device, and determining a size or number of bits of the pointer based on the operating bandwidth.

According to an example implementation of the method of FIG. 5, the first information word may include a first downlink control information segment of the segmented downlink control information, a pointer to the second resource to receive the second information word including the second downlink control information segment, and a cyclic redundancy check (CRC) bits, and wherein the first information word is received via a resource having an aggregation level, the method further including: receiving, by the user device, control information indicating an operating bandwidth for the user device; determining a size of the pointer based on the operating bandwidth; and, determining a size of the first downlink control information segment based on the size of the pointer and based on a fixed size of the first information word based on the aggregation level of the first information word.

According to an example implementation of the method of FIG. 5, wherein the decoding and attempting to decode are performed by the user device using a CRC-aided list decoder, wherein one or more of the information words include a cyclic redundancy check (CRC) bits, wherein a number of the CRC bits for at least one of the information words is based on a list size of the CRC-aided list decoder used by the user device.

According to an example implementation of the method of FIG. 5, wherein a size of the first information word, including the first downlink control information segment of the segmented downlink control information, the pointer to the second resource, and a cyclic redundancy check (CRC) bits, is fixed based on an aggregation level of the user device-specific resource via which the first codeword is received.

A downlink control channel, such as a physical downlink control channel (PDCCH), may be used to carry downlink control information (DCI), such as a downlink scheduling assignment(s) (e.g., including resource information and transport format, control information for spatial multiplexing), an uplink scheduling grant(s) (e.g., including resource information and transport format), power control information or power control commands for one or more terminals or UEs, and/or other downlink control information.

According to an example implementation, a downlink control channel, such as PDCCH, may carry a DCI (or multiple DCIs) each subframe. A cyclic redundancy check (CRC bits or parity bits for error detection, or CRC bits for error detection and correction) may be appended to the DCI (or control) payload. According to an example implementation, the control payload (e.g., including DCI) may be scrambled based on the user device identifier (e.g., scrambled based on a radio network temporary identifier or C-RNTI of the user device) to indicate that the DCI or control information is addressed to the specific user device identified by the C-RNTI. The user device may similarly perform descrambling based on the C-RNTI to determine if the received DCI is for the user device or not.

The PDCCH may carry control information on an aggregation of one or more control channel elements (CCEs), where a CCE is a set (or fixed size) of time-frequency resources, for example, including some number of bits (e.g., 72 bits per CCE, or other number of bits). Different aggregation levels may be used for the PDCCH resources used to transmit a DCI or control information. An aggregation level refers to the number of CCEs (or may indicate the amount of resources for the control information), such as a number of consecutive CCEs (aggregated) used to transmit DCI or downlink control information. For example, aggregation levels of 1, 2, 4 and 8 may allocate the indicated number of consecutive CCEs for the transmission of control information. In an example implementation, an aggregation level may be, for example one of the following aggregation levels: aggregation level=1, CCE index #1 (one CCE); aggregation level=2, CCE index #2 (two CCEs); aggregation level=4, CCE index #3 (4 CCEs); aggregation level=8, CCE index #4 (eight CCEs), by way of illustrative example. The number of CCEs (or aggregation level), e.g., one, two, four or eight CCEs for downlink resources to transmit control information, may vary based on a payload size of control information and/or the channel coding rate, and/or other factors, for example.

In some cases, a user device may be required to perform blind decoding of DCI information at a number of different resource locations and/or aggregation levels, which can be time-wise and computationally-wise very expensive for a user device.

According to an example implementation, as described in greater detail below, DCI information may be communicated from a BS to a user device using either 1) a single stage DCI in which an unsegmented (or non-segmented) DCI is sent within a subframe, or 2) a multi-stage (e.g., two-stage) segmented DCI in which a first DCI segment (or a first portion of the DCI sent to a user device) is sent to a user device via a specific resource (a first time-frequency resource) and for a known specific aggregation level (e.g., aggregation level=1, CCE index #1) along with a pointer (e.g., an identification of time-frequency resources) to a resource (to a second time-frequency resource) to receive a second DCI segment of the segmented DCI.

According to an example implementation, a user device may accommodate or handle both or either DCI transmission techniques (single stage DCI, or multi-stage DCI), and may reduce the number of search and decodings that may be necessary to obtain DCI information sent to the user device, e.g., to decrease the search space to obtain DCI. According to an example implementation, techniques described herein may provide for a more efficient and flexible acquisition and decoding of DCI information that was encoded using polar encoding, which may decrease DCI search space and can accommodate DCI sent via either single stage (unsegmented) DCI or multi-stage (segmented) DCI.

According to an example implementation, the user device may assume (initially) that if a segmented DCI is sent to the user device, the first DCI segment will be sent to a user device-specific resource for a known or specific aggregation level (e.g., aggregation level=1). And, if an attempt by the user device to decode a first DCI segment received via the user device-specific resource and aggregation level is unsuccessful, then the user device may assume that its DCI information has been sent from the BS as a single stage DCI, and a number (or plurality) of different resources may be searched and decoded (e.g., via blind decoding) to obtain such a single stage DCI. For example, the user device may first attempt, via multi-stage DCI, to obtain the first DCI segment at the user device-specific resource and specific aggregation level, before moving (e.g., in the case where the user device is unable to decode a first DCI segment) on to a blind search for a single stage (unsegmented) DCI. Thus, the user device may initially assume that DCI has been sent to the user device via multi-stage (segmented) DCI, and if the attempt to decode the first DCI segment is unsuccessful, then the user device may assume that the DCI has been sent via single stage (unsegmented) DCI and a search may be performed for a DCI received via one or more additional resources.

Figure 6:
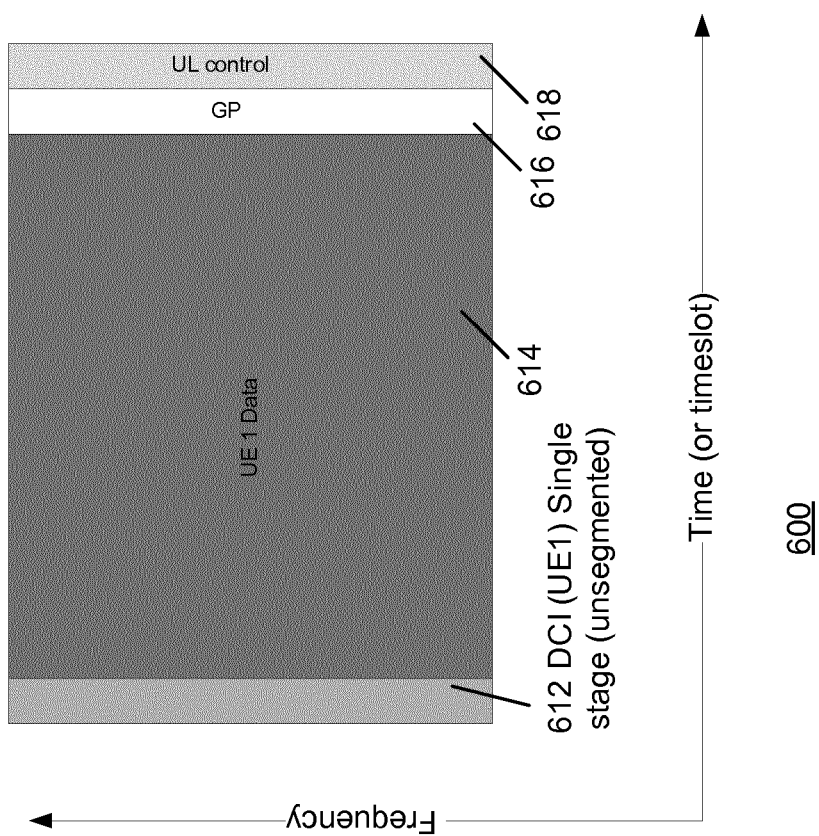
FIG. 6 is a diagram of a subframe in which DCI is transmitted as a single stage (unsegmented) DCI according to an example implementation.

FIG. 6 is a diagram of a subframe in which DCI is transmitted as a single stage (unsegmented) DCI according to an example implementation. Subframe 600 may include data 614 for UE1 (for user device 1), a guard period 616 (between downlink and uplink transmissions), and uplink (UL) control information 618. Subframe 600 may also include, e.g., within a first symbol, or a known set of symbols of subframe 600, a single stage (unsegmented) downlink control information (DCI) 612 for UE1. Blind decoding (e.g., where DCI may be sent at one of a plurality of resources, which may require searching and multiple decoding attempts) may be performed for the full payload. Also, for example, the UE/user device may not necessarily know whether it is supported with single stage (unsegmented) or multi-stage (segmented) DL control information.

Figure 7:
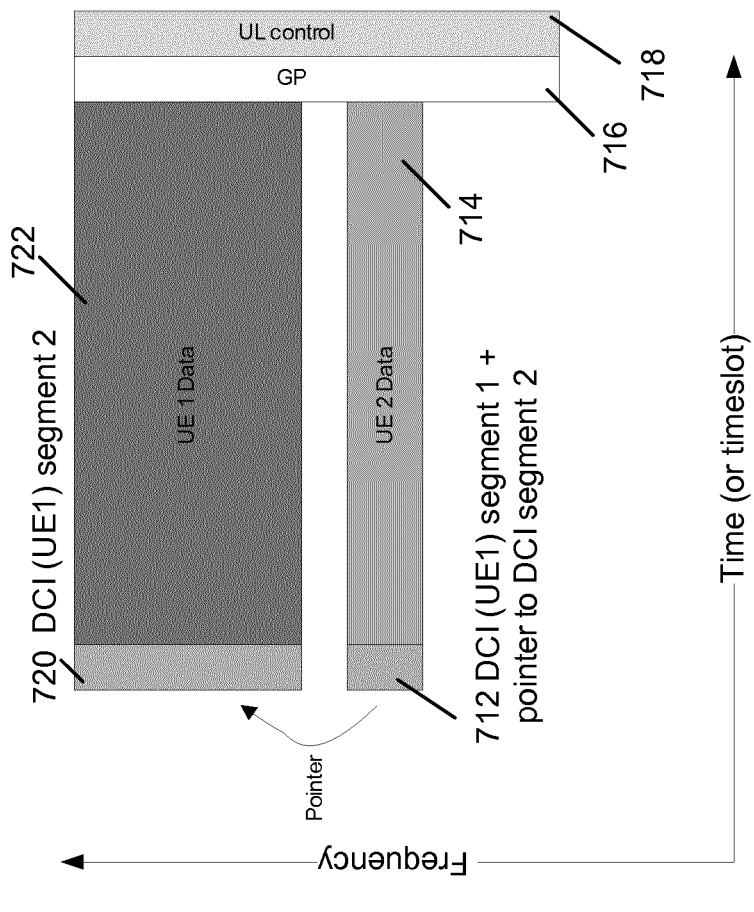
FIG. 7 is a diagram of a subframe in which DCI is transmitted as a multi-stage (segmented) DCI according to an example implementation.

FIG. 7 is a diagram of a subframe in which DCI is transmitted as a multi-stage (segmented) DCI according to an example implementation. FIG. 7 illustrates an example subframe structure where part of the resources is allocated to the UE1. Subframe 700 includes UE1 data 722, a guard period 716, an UL control information 718, and UE2 data 714. Other UEs may be operating (e.g., may be receiving and/or transmitting data and/or control information via) the same sub-frame with different frequency resources.

As shown in FIG. 7, the DCI for UE1 is a segmented DCI, e.g., the DCI is split into two segments. The subframe 700 may include control information 712 that includes a DCI segment 1 and a pointer to DCI segment 2 (e.g., the pointer identifying time-frequency resources for DCI segment 2). DCI segment 1 and the pointer may be provided before (in time) the UE2 data 714 and may be provided in frequency resources that are the same or at least overlapping with UE2 data 714, for example. DCI segment 2 720 may be provided via different frequency resources as DCI segment 1. DCI segment 2 may be provided before (in time) or in front of the frequency resources for the UE1 data 722, for example. This type of DCI transmission may be referred as a two-step or two-stage (or segmented) DL control (or two stage-DCI). In particular, the second level (or second stage) control channel can be indicated by the first level control channel, e.g., the time and frequency resource for the second level control channel that provides DCI segment 2 can be indicated in the control information of the first level control channel (or within the control information of the first stage or DCI segment 1).

According to an example implementation, while the user device or UE may not know if DCI is transmitted to the user device via single stage or two-stage DCI, the user device may initially assume that a two-stage DCI is provided, and then attempt to decode the DCI segment 1 and pointer at a user device-specific resource and a particular aggregation level (e.g., aggregation level=1, or other aggregation level known by both the BS and the UE). According to an example implementation, if the user device (e.g., UE1) is able to decode DCI segment 1, then the user device or UE1 knows that this is either a single stage DCI (if no pointer is found and thus will not search and decode further since the DCI has been found within a single stage) or that this is a first DCI segment of a two-stage DCI segment (e.g., if a pointer is included/found). In the case where decoding is successfully performed (on control information 712) and a pointer is provided/found, the user device or UE1 will decode the DCI segment 2 720 at the resource indicated by the pointer. If decoding of control information 712 failed, the UE may assume unsegmented DCI and the user device may then need to search and/or attempt to decode a number of other possible resources assuming a single stage transmission, because the DCI was not provided in the (user device-specific) first segment location 712 for a two-stage DCI. If single stage, then DCI may be located in a number (e.g., 44) of different locations, which may be checked (e.g., received and decoding may be attempted until DCI is successfully received). Thus, according to an example implementation, the user device may start or begin DCI acquisition process by receiving and decoding (or attempting to decode) the DCI segment 1 at the user device-specific resource. If decoding of the DCI segment 1 is successful, then the DCI may be efficiently obtained via two decoding processes, as opposed to the blind decoding that may be required for a single stage DCI.

Also, according to an example implementation, a two stage DCI may be used, where the first DCI segment may carry a first DCI segment+pointer to decode the rest of the DCI (pointer to second DCI segment). An advantage of a two stage DCI is to reduce the search space and improve the decoding latency and energy efficiency of the UE (e.g., by avoiding a blind search and decoding, at least in some cases). For the first DCI segment, a pointer to locate the second segment may be included/provided to reduce the search space for the second DCI segment. Moreover, RNTI (radio network temporary identifier, which identifies the user device/UE) scrambling (or RNTI encoding) may be used to distinguish UE specific DCI segment. However, according to an example implementation, scrambling of or on top of CRC (or scramble the CRC) may not be performed because, at least in some cases, the CRC may be used for error correction.

According to an example implementations, various techniques are described herein relating to one or more features, such as one or more of the following, by way of illustrative example: a decoding procedure that may accommodate both a single stage and two-stage (segmented) DCI, such as, for example, initially assuming a two-stage DCI and receiving and attempting to decode a first DCI segment at a known user device-specific resource and a specific aggregation level, determining a codeword size of polar codes (e.g., where a fixed codeword size and/or a fixed information word size may be associated with each aggregation level), a CRC attachment (e.g., where a variable number of CRC bits may be adjusted based on a list size used at the receiver/decoder), determining a size of a pointer to a second DCI segment based on an operating bandwidth of the user device, and a RNTI scrambling procedure (e.g., where DCI segment and pointer may be scrambled or encoded to indicate UE identity for the DCI, but CRC is not scrambled such as where CRC is used for error correction) for DL control transmission.

In an example implementation, a user device typically may not know that it is supported by a single stage (unsegmented DCI) or a two stage (segmented) DCI. Therefore, in an example implementation, to reduce the search space for DCI, the user device may initially assume it is supported by the two stage (segmented) transmission (that DCI is transmitted to the user device as a segmented DCI). The first stage DCI (first DCI segment) may be transmitted via a known or specific aggregation level and via a user-specific resource, e.g., via aggregation level 1 and starting with a fixed first CCE index (CCE index #1—refers to first resource location). A first CCE index may, for example, operate with a mother polar code of N1 (for example, 128 bits). The user device may, for example, initially go to resource of CCE index 1 to attempt to decode DCI, and if the user device cannot decode the DCI then the user device may assume that the DCI sent to the user device is a single stage (unsegmented) DCI, and the user device then searches other single stage locations/resources for DCI, for example.

Figure 8:
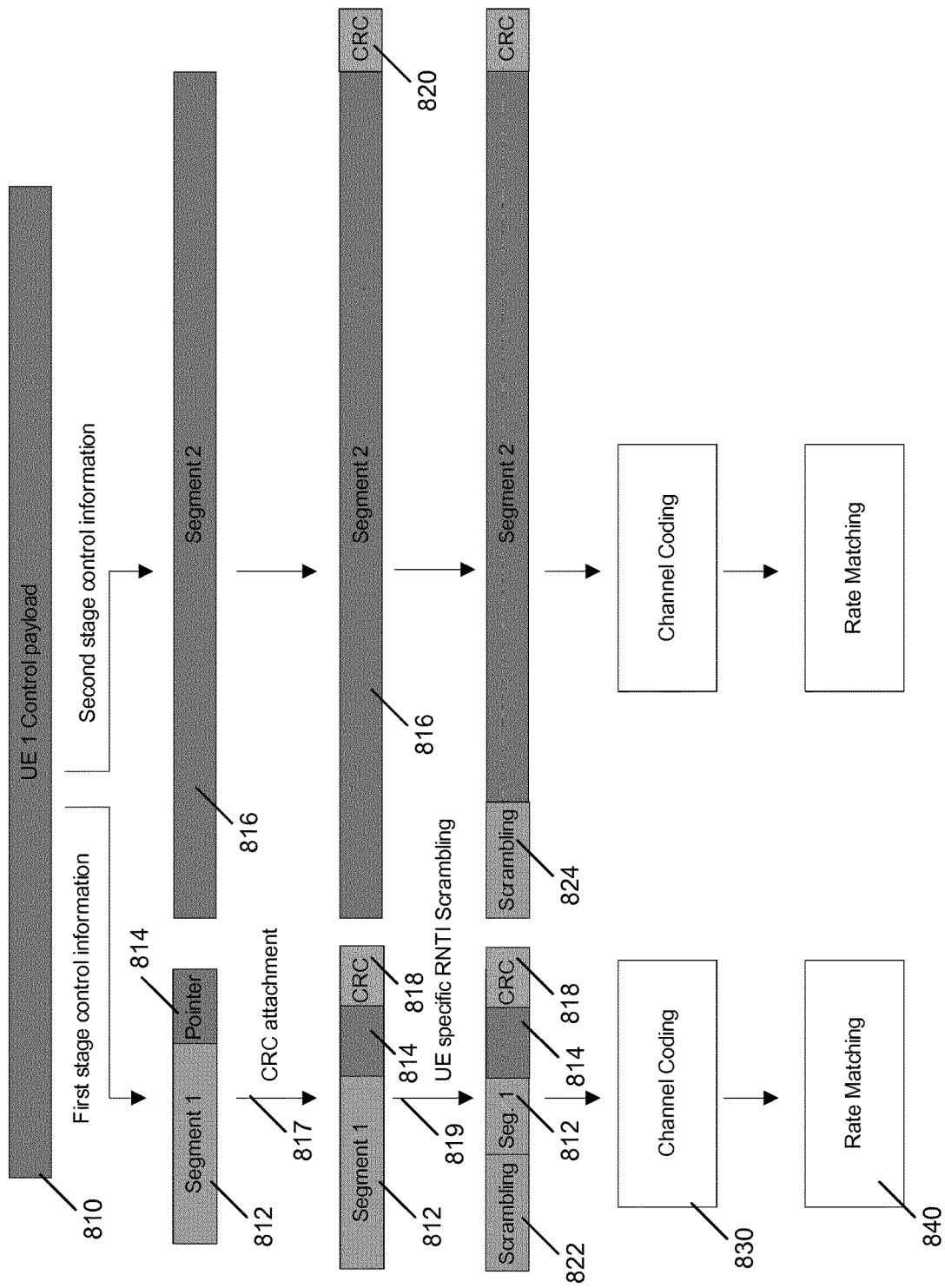
FIG. 8 is a diagram illustrating a process for channel coding that uses polar encoding according to an example implementation.

FIG. 8 is a diagram illustrating a process for channel coding that uses polar encoding according to an example implementation. Initially, a UE1 control payload 810 is generated at a transmitter (e.g., BS). The control payload 810 may be divided into a first stage control information and a second stage control information. The first stage control information may include a DCI segment 1 812 and a pointer 814 to a DCI segment 2 816. At 817, a CRC 818 is calculated and attached to the DCI segment 1 812 and pointer 814, and a CRC 820 is calculated and attached to DCI segment 2 816. At 819, a user device (or UE) specific encoding or scrambling of the DCI segment 1 and/or pointer 814 is performed (e.g., based on the UE identity such as a C-RNTI or cell radio network temporary identifier for UE1), to thereby encode or scramble the DCI segment 1 812 and/or pointer 814 to indicate the user device or UE identity for the DCI, e.g., without explicitly including the identity or C-RNTI of the UE1/user device. The RNTI specific scrambling or encoding of DCI segment 1 is shown as scrambled segment 1 822, for example. Note, that the scrambling of at least a portion of the first stage control information (e.g., scrambling over the DCI segment 1 or at least a portion of the DCI segment 1) is not performed over the CRC 818, e.g., where the CRC 818 is used for error correction. Similarly, DCI segment 2 may be encoded or scrambled with the UE identifier or RNTI (radio network temporary identifier) of the UE1 or user device, as indicated by scrambled DCI segment 2 (824).

Next, at channel coding block 830, polar encoding is performed on the resulting information word (that may include RNTI scrambled/encoded DCI segment 1 812 and 822, pointer 814 and CRC 818), e.g., where frozen bits may be added to the information word to extend the codeword to the fixed mother codeword size (N1) for the aggregation level (e.g., 128 bit codeword for aggregation level 1). A similar polar encoding is performed for the second stage control information, including the scrambled DCI segment 2 and CRC 820. The information word (e.g., including DCI segment 1 812, pointer 814 and CRC 818) input to polar (or channel) encoder 830 is of fixed size M1 (a fixed size associated with the aggregation level), and the codeword output from polar (or channel) encoder 830 is of a fixed mother codeword size N1 (a fixed mother codeword size associated with the aggregation level), such that M1/N1 is equal to the code rate. Similarly, the size of the information word (e.g., including segment 2 and CRC 820) input to polar (or channel) encoder 831 is of fixed size M2, and the output codeword output from polar encoder 831 is the fixed mother codeword size N2 for the aggregation level, where M2/N2 is equal to the code rate. Thus, a same or a different aggregation level may be used for the segment 2 or second stage control information, as compared to the segment 1 or the first stage control information.

At 840, rate matching is performed, including puncturing and/or repetition of the codeword output by polar (or channel) encoder 830 to perform rate matching to match the transmitted code block or codeword to a specific resource allocation, e.g., use puncturing reduce the codeword of the mother codeword size of 128 bits to the resource allocation of 72 bits, e.g., by puncturing the codeword by a puncturing pattern or algorithm. For example, a puncturing pattern, known by both the BS and the UE, may be used to puncture a mother codeword size (N1=128 bits, for example) to match the fixed resource allocation or a fixed codeword size (e.g., 72 bits) for a specific aggregation level. Different aggregation levels (different CCE indexes) may have different fixed information word sizes and different mother (before rate matching or puncturing) codeword sizes.

According to an example implementation, if two stage DCI is supported, the first stage DCI payload (information word, which is polar encoded) is (or may be) transmitted with the first CCE index with fixed mother code word size. In FIG. 8, an example segmentation and transmitter chain procedure is indicated for such two-stage DL control. The first segment includes a pointer that provides the location (or identification of time-frequency resources) of the second DCI segment.

According to an example implementation, the information word for DCI segment 1 812+pointer 814+CRC 818 may be a fixed size (M1), and N1 may be the size of the resulting codeword after polar encoding, such that M1/N1 always remains the same (the code rate) and the search space is not increased within the codeword after polar encoding, for example. The pointer size may vary in size depending on the operating bandwidth of the user device, e.g., where a larger operating bandwidth may typically mean a larger range of possible resources for DCI segment 2, hence, possibly requiring more bits or a larger pointer size to be able identify the resource of the DCI segment 2 within such larger range. Similarly, a reduced operating bandwidth for the user device may allow use of a smaller pointer 814, and thereby allow a larger DCI segment 1, so as to maintain fixed size (M1) of the information word for first stage control information or DCI segment 1. However, according to an example implementation, the size of DCI segment 1 should be determined such that M1 will remain constant. Thus, for example, if a user device/UE operating bandwidth is higher (more resource possibilities for second DCI segment, so a larger pointer may be required to reach all these greater possibilities of resources of DCI segment 2). In such an example, where the pointer is increased in size (more bits), the size of the DCI segment 1 is reduced to maintain a fixed control payload (information word) size (M1), where control payload is the information word (e.g., DCI segment 1, pointer and CRC) before polar encoding for first stage control information.

For example, a polar code block size is 72 bits for aggregation level=1, and mother codeword size for aggregation level=1 is 128 bits, so a fixed or known configuration for puncturing (or puncturing pattern) may be used at UE decoder, otherwise it may be necessary to check all puncturing combinations. In this example, at the transmitter, the last 56 bits of the 128 bit mother codeword may be punctured to reach the polar codeword size of 72 bits before transmission, or a random set of bits as indicated by a puncturing pattern may be punctured using a known pattern or algorithm that is known by the encoder and decoder. This known puncturing pattern may be used at the receiver or decoder to decode the received codeword to obtain the information word or control information (DCI segment 1 and pointer). Otherwise, a DCI search space may increase for the first stage DCI. A similar approach may consider for several fixed configurations if the allowed search space for first stage is greater than one.

According to an example implementation, when polar codes are supported with parity check concatenated polar codes (CRC bits provided only for error detection), a fixed configuration of parity bits and CRC (for error detection) is provided and used for decoding and error detection.

When CRC concatenated polar codes are used with list-X CRC aided decoding, a number of CRC bits are determined based on the list size of the list CRC aided decoder used at the user device. According to an example implementation, for CRC concatenated polar codes (CRC used for error detection and correction), RNTI scrambling (or RNTI encoding) may be performed on (at least a portion of) the DCI segment, but no RNTI scrambling or encoding is applied to the CRC part as the CRC bits should be used in the error correction. Otherwise, descrambling is required every time that CRC is used in the list decoder. FIG. 8 illustrates an example way to scramble information word or control information.

According to an example implementation, a size of the pointer 814 (FIG. 8) to DCI segment 2 depends on the operating bandwidth of the UE. It may be determined by using similar channel as in LTE PCFICH (Physical Control Format Indicator Channel), then the UE knows how many bits are now allocated to the pointer, e.g., based on operating bandwidth of the UE, which may be communicated by the BS to the UE. Based on the determined size of the pointer, the UE can separate the pointer 814 and DCI segment 1 812 in the first stage control information.

For example, there may be several possible operating bandwidths (each with a different number of subcarriers), such as 1.4 MHz channel, a 5 MHz channel, or a 10 MHz channel. There can be multiple channel bandwidths. PCFICH—can be used by BS to indicate bandwidth (channel BW or operating BW) for UE for all channels, including PDCCH. Then, the UE will determine the size of the pointer based on the indicated channel BW (bandwidth) size, which will cause UE to adjust size of DCI segment 1 to maintain a fixed payload size (or fixed information word size, based on the aggregation level). UE knows within a payload size, how many bits allocated to pointer, and then a fixed no of CRC bits, and a remaining bits are DCI segment; so the UE can use channel BW size to determine the pointer size, and then can decode the pointer.

In a first example implementation, the user device-specific resource may be used to provide only a DCI segment 1 of a multi-stage DCI segment. In such case, a pointer to segment 2 will be included, and failure to decode segment 1 may typically cause the user device to search and attempt to decode single stage DCI segment(s) at other resources. In a second example implementation, the user device specific resource may be used to transmit either a DCI segment 1 of a multi-stage DCI (in such case a pointer to DCI segment 2 would be provided as well), or an unsegmented DCI (single stage DCI) (in such case no pointer would be provided since the DCI is unsegmented).

For polar codes, there can be different polar code variants, such as, for example: a CRC concatenated polar code DCI segment+pointer+CRC—these are then encoded (using polar coding), where the CRC is used for error detection and correction. Parity check concatenated polar codes—DCI segment+pointer+CRC (for parity/error detection) are encoded using polar encoding. In both cases, a CRC may be provided. In first case, CRC is used for error detection and correction. In second case, a CRC is used for error detection only. For example, 16 CRC bits maybe sufficient for parity/error detection in the second case. However, for the first case (CRC for error detection and correction), a size of the CRC may vary based on a size of the list used by a receiver/decoder that uses CRC aided list decoding, for example.

Thus, for example, polar encoding may use different type of CRC, including CRC for parity check (or parity check/error detection polar codes) or CRC concatenation polar codes in which a CRC is used to allow for error detection and correction.

Figure 9:
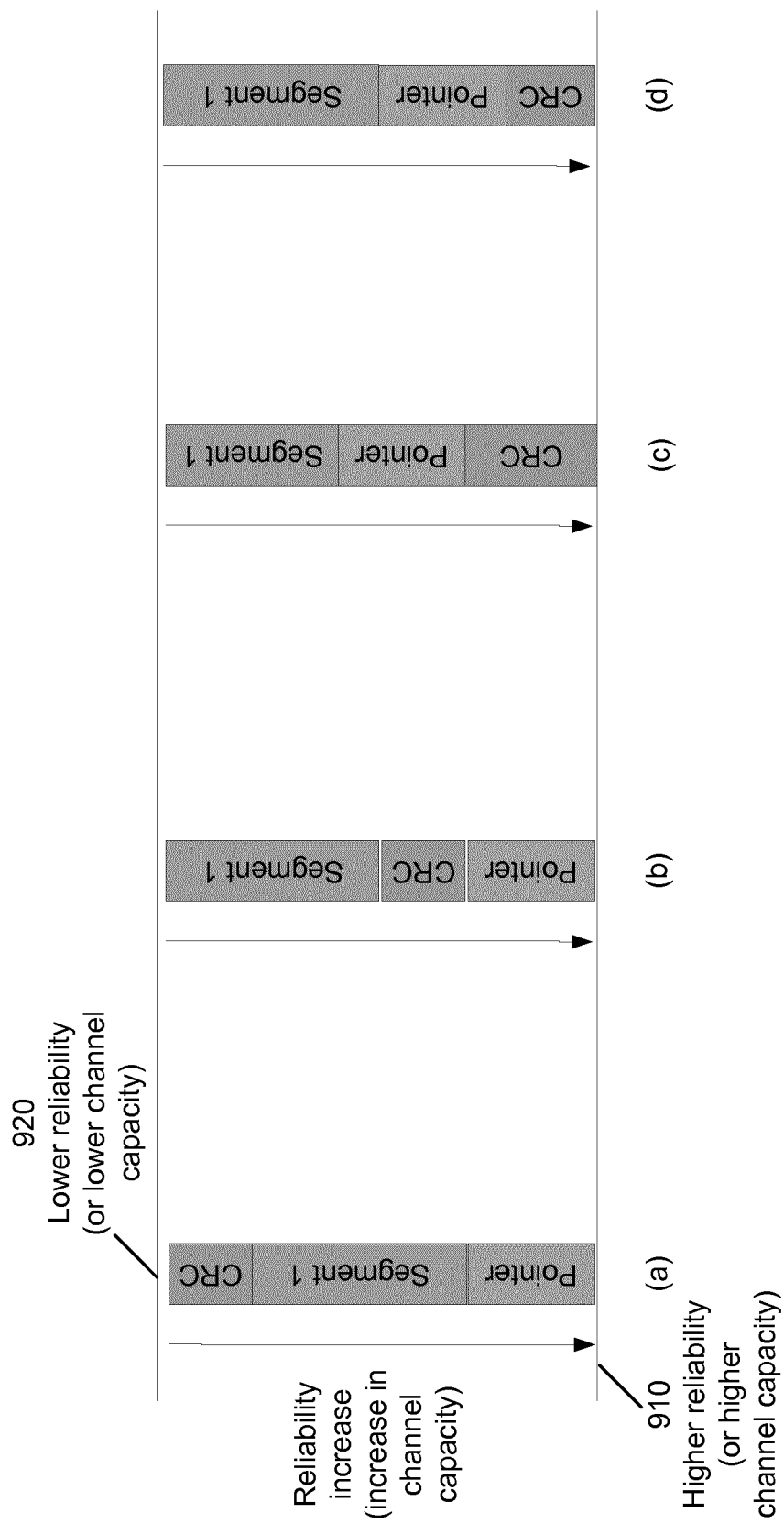
FIG. 9 is a diagram illustrating different options for bit positions for a DCI segment, a pointer and a CRC among different reliabilities or channel capacities.

FIG. 9 is a diagram illustrating different options for bit positions for a DCI segment, a pointer and a CRC among different reliabilities or channel capacities. As noted, polar encoding results in some bits or bit channels having higher reliability and channel capacity than other bits or bit channels. Various arrangements may be used to allocate or assign the DCI segment, pointer and CRC to different bits having different reliabilities. The DCI segment, the pointer may each be allocated to either a highest or higher reliability (or higher channel capacity) bits or bit channels, or to lower or even the lowest reliability (or lower channel capacity) bits or bit channels. And, for example, in some cases, the allocation of these control fields (segment, pointer and CRC) to different reliabilities may depend upon the type of polar code used, e.g., parity check or CRC concatenated polar code. The letters a), b), c) and d) below refer to FIG. 9.

a) In an example implementation, when parity check polar code is used, the CRC may be transmitted in the more or most reliable bits in the polar codeword, while the CRC may be in the lower or lowest reliability, and the segment 1 in between.

b) In another example implementation, when parity check polar codes are used, the CRC may be transmitted in the middle part of the reliable bits in the polar codeword, while putting the pointer in the most reliable bits, and the segment in the least reliable bits of the three control fields.

c) In another example implementation, when CRC concatenation (for error correction) is used, CRC may be transmitted in the best or most reliable bits in the polar codeword. CRC overhead may be larger compared to the cases a) and b).

d) In many or at least some of the polar concatenation variants (parity check or error correction), the CRC may be transmitted in the best or most reliable bits in the polar codeword. CRC overhead may be used for error correction and/or detection. If decoder type is not known for transmitter, type d (d))—(this subsection) arrangement can be a good choice since it can meet the requirement of both parity check concatenation and CRC concatenation.

If two stage DCI is supported, the second stage DCI payload can be different depending on the size of the control information.

Channel encoding for the second stage DCI: Different information block sizes (i.e., Segment 1+CRC) (M2) may have different mother codeword sizes (N2).

For a given mother polar codeword and resource allocation, code construction and CRC attachment should be fixed and blind decoding search space for segment 2 is lower.

When polar codes are supported with parity check concatenated polar codes, a fixed configuration of parity bits and CRC (for error detection) may be used, e.g., a fixed size of 16 bits of CRC for parity/error detection.

When CRC concatenated polar codes is used with list-X CRC aided decoding, a number or quantity of CRC bits should be determined based on the list size. In this case, for example, RNTI scrambling or RNTI encoding is not typically applied for the CRC part as the CRC will be used in the error correction. Otherwise, descrambling is required every time that CRC is used in the list decoder. Thus, for example, when CRC aided list decoder is used, a number of CRC bits to be used may be determined based on the UE capability, e.g., depending on the list size.

If single stage DCI is supported, the blind decoding may start or begin with the first CCE index with fixed mother code word size (assuming two-stage is supported), then moves towards all possible aggregation levels to with predefined polar codeword configurations. To avoid collision, the first CCE index is UE-specific, and may be randomly determined or randomly assigned, to avoid collision with other UEs. It can be randomized by harsh function similarly as LTE system. In detail, $Y_k=(A \cdot Y_{k-1}) \bmod D$, where $Y_{-1}=n_{RNTI} \neq 0, A=39827, D=65537$ and $k=\lfloor n_s/\rfloor$, $n_s$ is the slot number within a radio frame. Where Yk is CCE to be checked first for UE, for given subframe and bandwidth. Start of first CCE index may depend on UE (its RNTI), BW (bandwidth), and subframe, so as to distribute the first CCE index to be decoded by different UEs (to obtain DCI).

Figure 10:
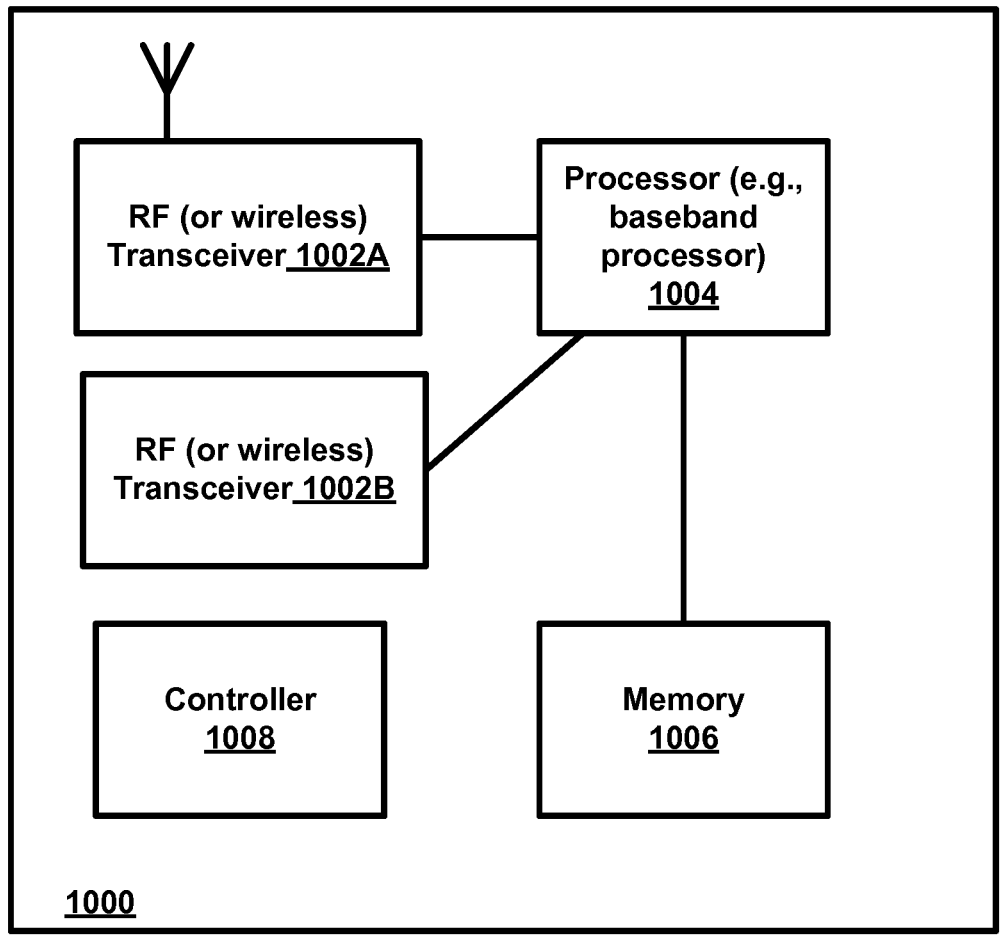
FIG. 10 is a block diagram of a node or wireless station (e.g., network device, base station/access point or mobile station/user device/UE) according to an example implementation.

FIG. 10 is a block diagram of a wireless station (e.g., AP, BS, eNB (macro or micro), UE or user device) 1000 according to an example implementation. The wireless station 1000 may include, for example, one or two RF (radio frequency) or wireless transceivers 1002A, 1002B, where each wireless transceiver includes a transmitter to transmit signals and a receiver to receive signals. The wireless station also includes a processor or control unit/entity (controller) 1004 to execute instructions or software and control transmission and receptions of signals, and a memory 1006 to store data and/or instructions.

Processor 1004 may also make decisions or determinations, generate frames, packets or messages for transmission, decode received frames or messages for further processing, and other tasks or functions described herein. Processor 1004, which may be a baseband processor, for example, may generate messages, packets, frames or other signals for transmission via wireless transceiver 1002 (1002A or 1002B). Processor 1004 may control transmission of signals or messages over a wireless network, and may control the reception of signals or messages, etc., via a wireless network (e.g., after being down-converted by wireless transceiver 1002, for example). Processor 1004 may be programmable and capable of executing software or other instructions stored in memory or on other computer media to perform the various tasks and functions described above, such as one or more of the tasks or methods described above. Processor 1004 may be (or may include), for example, hardware, programmable logic, a programmable processor that executes software or firmware, and/or any combination of these. Using other terminology, processor 1004 and transceiver 1002 together may be considered as a wireless transmitter/receiver system, for example.

In addition, referring to FIG. 10, a controller (or processor) 1008 may execute software and instructions, and may provide overall control for the station 1000, and may provide control for other systems not shown in FIG. 10, such as controlling input/output devices (e.g., display, keypad), and/ or may execute software for one or more applications that may be provided on wireless station 1000, such as, for example, an email program, audio/video applications, a word processor, a Voice over IP application, or other application or software.

In addition, a storage medium may be provided that includes stored instructions, which when executed by a controller or processor may result in the processor 1004, or other controller or processor, performing one or more of the functions or tasks described above.

According to another example implementation, RF or wireless transceiver(s) 1002A/1002B may receive signals or data and/or transmit or send signals or data. Processor 1004 (and possibly transceivers 1002A/1002B) may control the RF or wireless transceiver 1002A or 1002B to receive, send, broadcast or transmit signals or data.

The embodiments are not, however, restricted to the system that is given as an example, but a person skilled in the art may apply the solution to other communication systems. Another example of a suitable communications system is the 5G concept. It is assumed that network architecture in 5G will be quite similar to that of the LTE-advanced. 5G is likely to use multiple input—multiple output (MIMO) antennas, many more base stations or nodes than the LTE (a so-called small cell concept), including macro sites operating in co-operation with smaller stations and perhaps also employing a variety of radio technologies for better coverage and enhanced data rates.

It should be appreciated that future networks will most probably utilize network functions virtualization (NFV) which is a network architecture concept that proposes virtualizing network node functions into "building blocks" or entities that may be operationally connected or linked together to provide services. A virtualized network function (VNF) may comprise one or more virtual machines running computer program codes using standard or general type servers instead of customized hardware. Cloud computing or data storage may also be utilized. In radio communications this may mean node operations may be carried out, at least partly, in a server, host or node operationally coupled to a remote radio head. It is also possible that node operations will be distributed among a plurality of servers, nodes or hosts. It should also be understood that the distribution of labor between core network operations and base station operations may differ from that of the LTE or even be non-existent.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, a data processing apparatus, e.g., a programmable processor, a computer, or multiple computers. Implementations may also be provided on a computer readable medium or computer readable storage medium, which may be a non-transitory medium. Implementations of the various techniques may also include implementations provided via transitory signals or media, and/or programs and/or software implementations that are downloadable via the Internet or other network(s), either wired networks and/or wireless networks. In addition, implementations may be provided via machine type communications (MTC), and also via an Internet of Things (IOT).

The computer program may be in source code form, object code form, or in some intermediate form, and it may be stored in some sort of carrier, distribution medium, or computer readable medium, which may be any entity or device capable of carrying the program. Such carriers include a record medium, computer memory, read-only memory, photoelectrical and/or electrical carrier signal, telecommunications signal, and software distribution package, for example. Depending on the processing power needed, the computer program may be executed in a single electronic digital computer or it may be distributed amongst a number of computers.

Furthermore, implementations of the various techniques described herein may use a cyber-physical system (CPS) (a system of collaborating computational elements controlling physical entities). CPS may enable the implementation and exploitation of massive amounts of interconnected ICT devices (sensors, actuators, processors microcontrollers, . . . ) embedded in physical objects at different locations. Mobile cyber physical systems, in which the physical system in question has inherent mobility, are a subcategory of cyber-physical systems. Examples of mobile physical systems include mobile robotics and electronics transported by humans or animals. The rise in popularity of smartphones has increased interest in the area of mobile cyber-physical systems. Therefore, various implementations of techniques described herein may be provided via one or more of these technologies.

A computer program, such as the computer program(s) described above, can be written in any form of programming language, including compiled or interpreted languages, and can be deployed in any form, including as a stand-alone program or as a module, component, subroutine, or other unit or part of it suitable for use in a computing environment. A computer program can be deployed to be executed on one computer or on multiple computers at one site or distributed across multiple sites and interconnected by a communication network.

Method steps may be performed by one or more programmable processors executing a computer program or computer program portions to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer, chip or chipset. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in, special purpose logic circuitry.

To provide for interaction with a user, implementations may be implemented on a computer having a display device, e.g., a cathode ray tube (CRT) or liquid crystal display (LCD) monitor, for displaying information to the user and a user interface, such as a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A method of decoding downlink control information that was encoded using polar encoding, the method comprising:
   receiving, by a user device in a wireless network via a user device-specific resource, a first codeword;
   attempting to decode the first codeword to obtain a first information word that includes a first downlink control information segment of a segmented downlink control information, and a pointer to a second resource to receive a second information word including a second downlink control information segment of the segmented downlink control information, and cyclic redundancy check (CRC) bits; and
   performing the following in response to the attempting to decode the first codeword being successful:
      receiving, via the second resource included in the first information word, a second codeword; and
      decoding the second codeword to obtain a second information word including a second downlink control information segment of the segmented downlink control information.

2. The method of claim 1 and further comprising performing the following in response to the attempting to decode the first codeword is not successful:
   receiving a third codeword; and
   decoding the third codeword to obtain an unsegmented downlink control information.

3. The method of claim 2, the method comprises:
   first, attempting to decode the first codeword, which was received via a user device-specific resource location for segmented downlink control information, to obtain a first information word that includes the first downlink control information segment of the segmented downlink control information, based on an initial assumption that downlink control information is sent to the user device as a segmented downlink control information; and
   second, in response to the attempting to decode the first codeword to obtain a first downlink control information segment is unsuccessful, decoding the third codeword to obtain an unsegmented downlink control information based on an assumption that downlink control information is sent to the user device as an unsegmented downlink control information.

4. The method of claim 1, wherein the receiving the first codeword comprises:
   receiving, by a user device in a wireless network via a user device-specific resource associated with a lowest resource aggregation level of a plurality of resource aggregation levels, the first codeword.

5. The method of claim 1, wherein user device-specific scrambling has been performed on the first downlink control information segment of the segmented downlink control information and the pointer to the second resource but not on the CRC bits.

6. The method of claim 1, and further comprising:
   receiving, by the user device, control information indicating an operating bandwidth for the user device; and
   determining a size or number of bits of the pointer based on the operating bandwidth.

7. The method of claim 1, wherein the first information word is received via resource of an aggregation level, the method further comprising:
   receiving, by the user device, control information indicating an operating bandwidth for the user device;
   determining a size of the pointer based on the operating bandwidth; and
   determining a size of the first downlink control information segment based on the size of the pointer and based on a fixed size of the first information word based on the aggregation level of the first information word.

8. A method of any of claim 1 wherein the decoding and attempting to decode are performed by the user device using a CRC-aided list decoder, wherein one or more of the information words include the cyclic redundancy check (CRC) bits, wherein a number of the CRC bits for at least one of the information words is based on a list size of the CRC-aided list decoder used by the user device.

9. A method of claim 1 wherein a size of the first information word, including the first downlink control information segment of the segmented downlink control information, the pointer to the second resource, and the cyclic redundancy check (CRC) bits, is fixed based on an aggregation level of the user device-specific resource via which the first codeword is received.

10. A method of claim 1 wherein at least one of a downlink control information segment, the pointer and the cyclic redundancy check are assigned to bits or channels having higher capacity based on polar encoding.

11. A method of claim 1 wherein the downlink control information segment, the pointer and the cyclic redundancy check are assigned to bits or channels having different capacity based on a variant of polar encoding that is used.

12. An apparatus configured to decode downlink control information that was encoded using polar encoding, the apparatus comprising at least one processor and at least one memory including computer instructions, when executed by the at least one processor, cause the apparatus to:
   attempt, based on an initial assumption by a user device of a segmented downlink control information, to decode a first codeword provided via a user device-specific resource, the first codeword including a first downlink control information segment, a pointer to a second downlink control information segment of a segmented downlink control information, and cyclic redundancy check (CRC) bits;
  decode, in response to the attempting to decode being successful, based on the pointer, a second codeword that includes the second downlink control information segment of the segmented downlink control information; and
  otherwise, in response to the attempting to decode being unsuccessful, make an assumption of a non-segmented downlink control information and decoding a third codeword to obtain a non-segmented downlink control information.

13. The apparatus of claim 12 wherein at least one of a downlink control information segment, the pointer and a cyclic redundancy check are assigned to bits or channels having higher capacity based on polar encoding.

14. The apparatus of claim 12, further causing the apparatus to:
  receive, by the user device, control information indicating an operating bandwidth for the user device; and
  determine a size or number of bits of the pointer based on the operating bandwidth.

15. A computer program product comprising a non-transitory computer-readable storage medium and storing executable code that, when executed by at least one data processing apparatus, is configured to cause the at least one data processing apparatus to perform a method, comprising:
  receiving, by a user device in a wireless network via a user device-specific resource, a first codeword;
  attempting to decode the first codeword to obtain a first information word that includes a first downlink control information segment of a segmented downlink control information, a pointer to a second resource to receive a second information word including a second downlink control information segment of the segmented downlink control information, and cyclic redundancy check (CRC) bits; and
  performing the following in response to the attempting to decode the first codeword being successful:
    receiving, via the second resource included in the first information word, a second codeword; and
    decoding the second codeword to obtain a second information word including a second downlink control information segment of the segmented downlink control information.

16. An apparatus for decoding downlink control information that was encoded using polar encoding, the apparatus comprising at least one processor and at least one memory including computer instructions, when executed by the at least one processor, cause the apparatus to:
  receive, by a user device in a wireless network via a user device-specific resource, a first codeword;
  attempt to decode the first codeword to obtain a first information word that includes a first downlink control information segment of a segmented downlink control information, a pointer to a second resource to receive a second information word including a second downlink control information segment of the segmented downlink control information, and cyclic redundancy check (CRC) bits; and
  perform the following in response to the attempting to decode the first codeword being successful:
    receive, via the second resource included in the first information word, a second codeword; and
    decode the second codeword to obtain a second information word including a second downlink control information segment of the segmented downlink control information.

17. The apparatus of claim 16, wherein the causing the apparatus to receive the first codeword comprises causing the apparatus to:
  receive, by a user device in a wireless network via a user device-specific resource associated with a lowest resource aggregation level of a plurality of resource aggregation levels, the first codeword.

18. The apparatus of claim 16, wherein user device-specific scrambling has been performed on the first downlink control information segment of the segmented downlink control information and the pointer to the second resource but not on the CRC bits.

19. The apparatus of claim 16, and wherein the first information word is received via resource of an aggregation level, and further causing the apparatus to:
  receive, by the user device, control information indicating an operating bandwidth for the user device;
  determine a size of the pointer based on the operating bandwidth; and
  determine a size of the first downlink control information segment based on the size of the pointer and based on a fixed size of the first information word based on the aggregation level of the first information word.

20. The apparatus of claim 16 wherein a size of the first information word, including the first downlink control information segment of the segmented downlink control information, the pointer to the second resource, and the cyclic redundancy check (CRC) bits, is fixed based on an aggregation level of the user device-specific resource via which the first codeword is received.

* * * * *